(12) United States Patent
Huang

(10) Patent No.: US 7,567,440 B2
(45) Date of Patent: Jul. 28, 2009

(54) APPARATUS AND METHOD SECURING A COMPONENT IN A RECEIVER STRUCTURE

(75) Inventor: Hardy Huang, Shanghai (CN)

(73) Assignee: Lineage Power Corporation, Mesquite, TX (US)

( * ) Notice: Subject to any disclaimer, the term of this patent is extended or adjusted under 35 U.S.C. 154(b) by 131 days.

(21) Appl. No.: 11/315,545

(22) Filed: Dec. 22, 2005

(65) Prior Publication Data

US 2007/0145872 A1 Jun. 28, 2007

(51) Int. Cl.
*H05K 5/00* (2006.01)
*H05K 7/00* (2006.01)
*H05K 7/16* (2006.01)

(52) U.S. Cl. ............. 361/732; 361/679.37; 361/679.39; 361/679.58; 361/725; 361/726; 361/727; 361/728; 361/730

(58) Field of Classification Search ................. 361/740, 361/747, 679.33, 679.37–679.39, 725–732; 200/61.7, 61.82

See application file for complete search history.

(56) References Cited

U.S. PATENT DOCUMENTS

| | | | | |
|---|---|---|---|---|
| 2,588,356 A | * | 3/1952 | Burgoyne | 292/182 |
| 3,011,851 A | * | 12/1961 | Verga et al. | 312/332.1 |
| 3,140,905 A | * | 7/1964 | Trotter et al. | 312/332.1 |
| 4,125,305 A | * | 11/1978 | Kasindorf | 312/332.1 |
| 5,379,184 A | * | 1/1995 | Barraza et al. | 361/685 |
| 5,563,767 A | * | 10/1996 | Chen | 361/685 |
| 5,586,003 A | * | 12/1996 | Schmitt et al. | 361/679.58 |
| 5,740,012 A | * | 4/1998 | Choi | 361/686 |
| 5,765,933 A | * | 6/1998 | Paul et al. | 312/332.1 |
| 5,949,652 A | * | 9/1999 | McAnally et al. | 361/726 |
| 5,959,834 A | * | 9/1999 | Chang | 361/685 |
| 6,227,630 B1 | * | 5/2001 | Brown et al. | 312/223.2 |
| 6,547,347 B2 | * | 4/2003 | Saito et al. | 312/223.1 |
| 6,820,953 B2 | * | 11/2004 | Wojcik | 312/332.1 |
| 2002/0122271 A1 | * | 9/2002 | coffin et al. | 360/92 |

* cited by examiner

*Primary Examiner*—Jayprakash N Gandhi
*Assistant Examiner*—Quinn Hunter
(74) *Attorney, Agent, or Firm*—Law Office of Donald D. Mondul

(57) ABSTRACT

An apparatus securing a component in a receiver structure having an engagement structure includes: (a) An actuator coupled with the component for swinging movement along a first axis between a first position and a second position. (b) At least one engaging member coupled with the component and responding to the actuator moving to one position of the first and second position to move in a second axis substantially perpendicular with the first axis into an engaging position with the engagement structure. (c) At least one bias member coupled with the at least one engaging member. The at least one bias member urges the at least one engaging member from the engaging position. The actuator is fitted with the component to permit at least partial insertion of the actuator within the receiver structure.

15 Claims, 4 Drawing Sheets

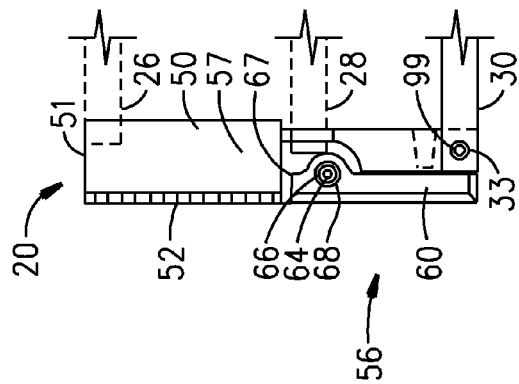
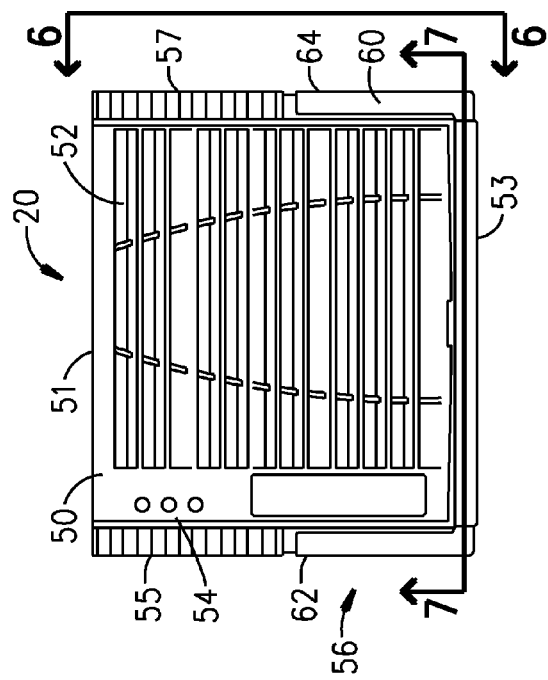
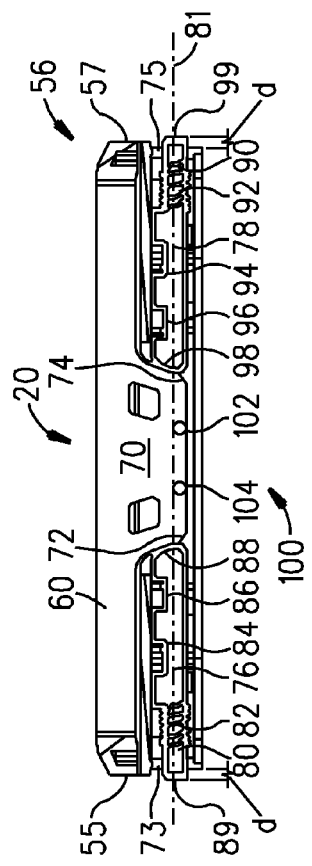

APPARATUS AND METHOD SECURING A COMPONENT IN A RECEIVER STRUCTURE

BACKGROUND OF THE INVENTION

The present invention is directed to replaceable components in a system, and especially to replaceable electrical components configured for mounting in a receiving structure. By way of example and not by way of limitation, such replaceable electrical components include rectifier component units configured for sliding mounting within a receiver structure such as a receiving rack having a plurality of engagement structures. Each respective engagement structure of the plurality of engagement structures releasably holds a respective rectifier component unit in an electrically engaged relation with circuitry coupled with the receiving rack.

Economy of space is at a premium in such component-rack arrangements in order that maximum use of rack space may be effected to create as compact an arrangement as possible. One design challenge associated with economy of space in component-rack arrangements is how to reduce room required for a locking system to effect releasably locking a component within a receiving structure in the rack.

There is a need for an effective low volume locking system to effect releasably locking a component within a receiver structure, such as in a receiving rack.

SUMMARY OF THE INVENTION

An apparatus securing a component in a receiver structure having an engagement structure includes: (a) An actuator coupled with the component for swinging movement along a first axis between a first position and a second position. (b) At least one engaging member coupled with the component and responding to the actuator moving to one position of the first and second position to move in a second axis substantially perpendicular with the first axis into an engaging position with the engagement structure. (c) At least one bias member coupled with the at least one engaging member. The at least one bias member urges the at least one engaging member from the engaging position. The actuator is fitted with the component to permit at least partial insertion of the actuator within the receiver structure.

A method securing a component in a receiver structure having an engagement structure includes the steps of: (a) In no particular order: (1) Providing an actuator coupled with the component for swinging movement along a first axis between a first position and a second position. The actuator is fitted with the component to permit at least partial insertion of the actuator within the receiver structure. (2) Providing at least one engaging member coupled with the component. The at least one engaging member responds to the actuator moving to one position of the first position and the second position to move in a second axis substantially perpendicular with the first axis into an engaging position with the engagement structure. (3) providing at least one bias member coupled with the at least one engaging member. The at least one bias member urges the at least one engaging member from the engaging position. (b) With the actuator in another of the first position and the second position than the one position, inserting the component into the receiver structure until the actuator substantially abuts the at least one engaging member. (c) Moving the actuator from the other position to the one position with sufficient force to overcome the urging by the bias member to effect moving the at least one engaging member to the engaging position.

It is, therefore, an object of the present invention to provide an effective low volume locking system to effect releasably locking a component within a receiver structure, such as in a receiving rack.

Further objects and features of the present invention will be apparent from the following specification and claims when considered in connection with the accompanying drawings, in which like elements are labeled using like reference numerals in the various figures, illustrating the preferred embodiments of the invention.

BRIEF DESCRIPTION OF THE DRAWINGS

FIG. 5 is a front view of a portion of a component including the securing apparatus of the present invention in a locked orientation.

FIG. 6 is a side view of a portion of the component taken in direction 6-6 in FIG. 5 including the securing apparatus of the present invention in a locked orientation.

FIG. 7 is a side view of a portion of the component taken along section 7-7 in FIG. 5 including the securing apparatus of the present invention in a locked orientation.

DETAILED DESCRIPTION OF THE PREFERRED EMBODIMENT

Figure 1:
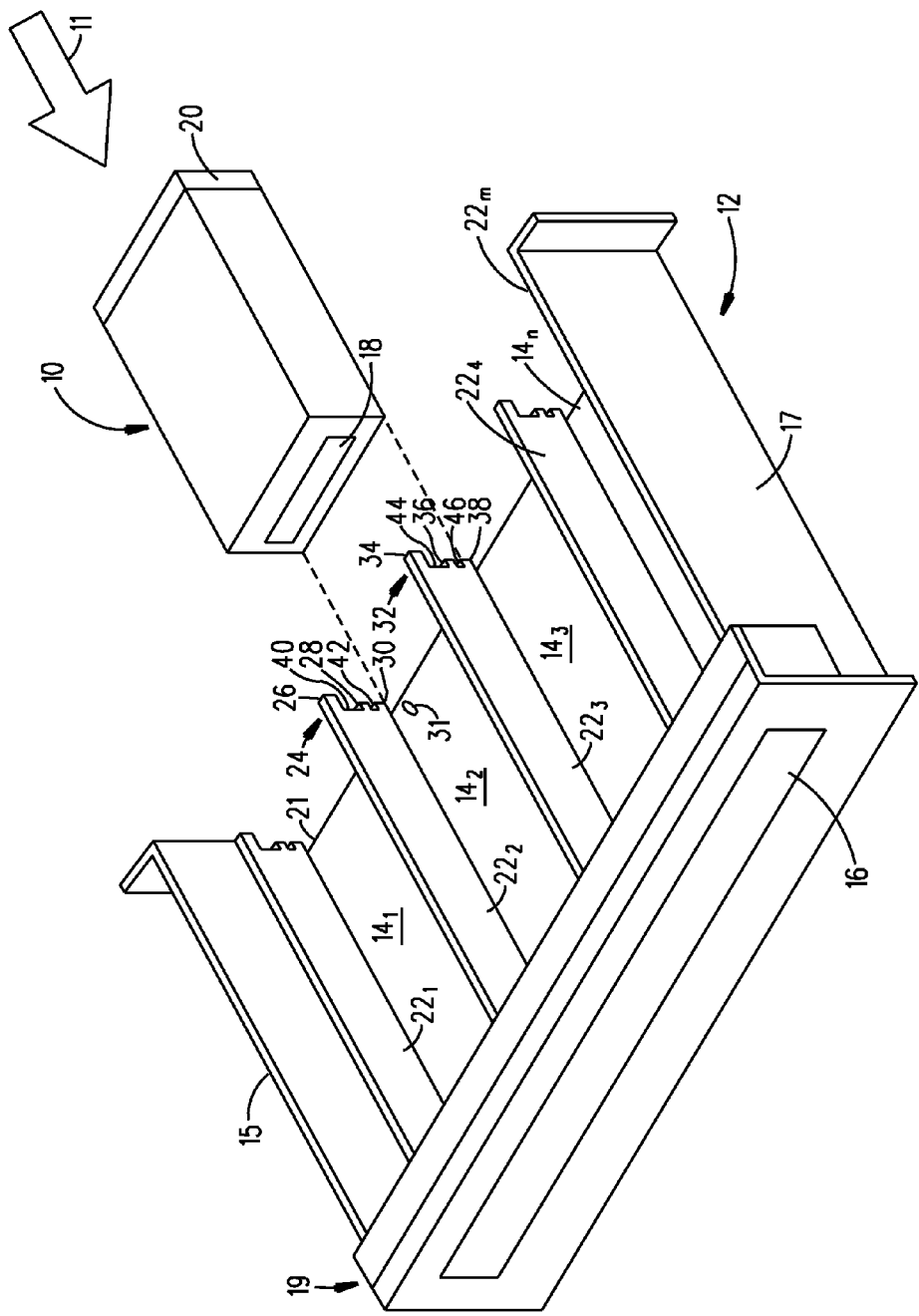
FIG. 1 is a schematic perspective illustration of a component configured for mounting within a receiving structure in a receiving rack.

FIG. 1 is a schematic perspective illustration of a component configured for mounting within a receiving structure in a receiving rack. In FIG. 1, a component 10 is poised for engagement with a receiver structure or receiving rack 12. Receiving rack 12 presents a plurality of receiving bays $14_1$, $14_2$, $14_3$, $14_n$. The indicator "n" is employed to signify that there can be any number of receiving bays in receiving rack 12. The inclusion of four receiving bays $14_1$, $14_2$, $14_3$, $14_n$ in FIG. 1 is illustrative only and does not constitute any limitation regarding the number of receiving bays that may be included in a receiving rack employed with the present invention. Component 10 is illustrated in FIG. 1 poised for installation in receiving rack 12 by urging component 10 substantially in the direction indicated by arrow 11 into engagement with receiving rack 12 within receiving bay $14_2$.

Receiving rack 12 includes side members 15, 17 and a rear member 19 that cooperate to establish a rigid structure. A bottom member 21 joins side members 15, 17 and rear member 19 to further contribute to rigidity of receiving rack 12. More than one receiving rack 12 may be stacked vertically or arranged horizontally (not shown in FIG. 1) to provide for connecting more components 10 within a system or apparatus. Receiving rack 12 also includes interface circuitry, indicated generally at 16, configured for traversing rear member 19 to effect engagement with component interface circuitry, indicated generally at 18, provided in inserted components 10. Interface circuitry 16 and component interface circuitry 18 cooperate to provide predetermined interface connections (not shown in detail in FIG. 1) between inserted components 10 and circuitry external of receiving rack 12 (not shown in FIG. 1).

Component 10 includes a front piece 20 that is exposed for access by a user when component 10 is installed in an inserted orientation within receiving rack 12. Front piece 20 may present connection loci, indicator lights or other user-interface structures to facilitate employment of component 10 in a system or apparatus coupled with receiving rack 12. Details of user-interface structures in front piece 20 are not illustrated in FIG. 1.

Receiving bays $14_1$, $14_2$, $14_3$, $14_n$ are bounded by separation structures such as walls $22_1$, $22_2$, $22_3$, $22_4$, $22_m$ (wall $22_m$ is not visible in FIG. 1 but is substantially similarly situated with respect to side member 17 as separating wall $22_1$ is situated with respect to side member 15. The indicator "m" is employed to signify that there can be any number of walls in receiving rack 12 oriented to bound a predetermined number of receiving bays $14_n$. The inclusion of five walls $22_1$, $22_2$, $22_3$, $22_4$, $22_m$ in FIG. 1 is illustrative only and does not constitute any limitation regarding the number of walls that may be included in a receiving rack employed with the present invention.

Walls $22_2$, $22_3$ will be described in detail as representative walls; other walls $22_1$, $22_4$, $22_m$ are substantially similar in construction as representative walls $22_2$, $22_3$. Walls $22_2$, $22_3$ bound representative receiving bay $14_2$; other receiving bays $14_1$, $14_3$, $14_n$ are substantially similar in construction as representative receiving bay $14_2$. Wall $22_2$ includes a locking-and-rejection structure 24 that is preferably integrally formed with wall $22_2$. Locking-and-rejection structure 24 includes integral tabs 26, 28, 30 cooperating to establish and bound loci or slots 40, 42. One or more of tabs 26, 28, 30 may have an aperture provided therethrough (not shown in detail in FIG. 1; see aperture 33 in tab 30; FIG. 6). Wall $22_3$ includes a locking-and-rejection structure 32 that is preferably integrally formed with wall $22_3$. Locking-and-rejection structure 32 includes integral tabs 34, 36.38 cooperating to establish and bound low loci or slots 44, 46. One or more of tabs 34, 36, 38 may have an aperture provided therethrough (not shown in detail in FIG. 1) in a manner and location substantially similar to the provision of aperture 33 in tab 30 (FIG. 6). One or more of locking-and-rejection structures 24, 32 cooperates with front piece 20 during installation of component 10 within receiving bay $14_2$ to effect locking of component 10 within receiving bay $14_2$. One or more of locking-and-rejection structures 24, 32 may also cooperate with front piece 20 to aid removal of component 10 from receiving bay $14_2$. Other walls $22_1$, $22_4$, $22_m$ preferably include substantially similar locking-and-rejection structures to cooperate in installation and removal of components with respect to receiving bays $14_1$, $14_3$, $14_n$.

By way of further example and not by way of limitation, apertures 33 may be provided in bottom member 21 and a next adjacent bottom member in an adjacent vertically stacked receiving rack (not shown in FIG. 1) to accommodate alternate designs of the present invention (described later herein). Only one representative aperture 33 is shown in FIG. 1 in receiving bay $14_2$; other apertures 31 may be provided in various receiving bays $14_n$ as required.

Figure 3:
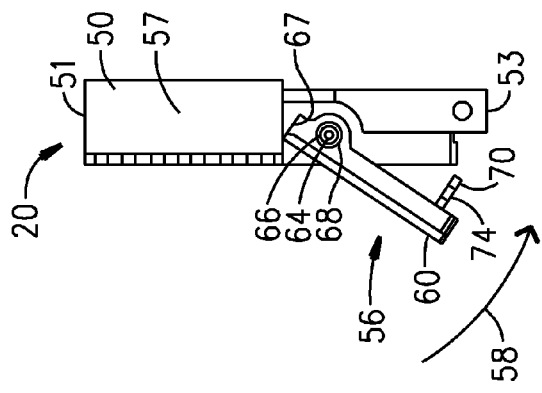
FIG. 3 is a side view of a portion of the component taken in direction 3-3 in FIG. 1 including the securing apparatus of the present invention in an unlocked orientation.
Figure 2:
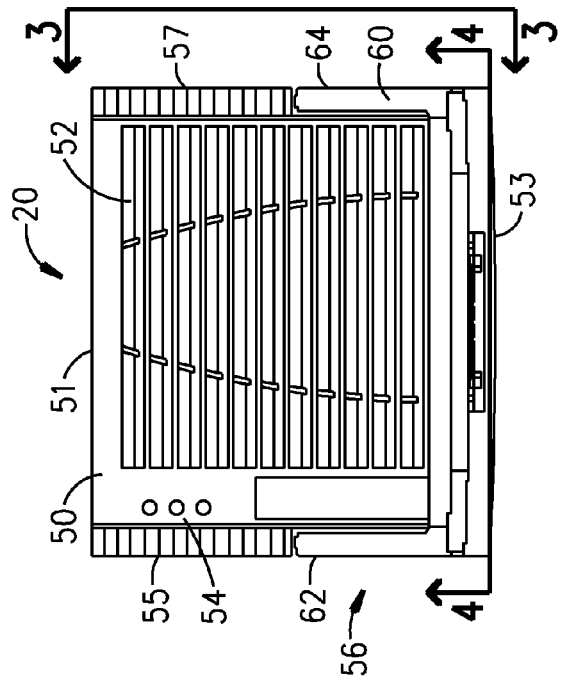
FIG. 2 is a front view of a portion of a component including the securing apparatus of the present invention in an unlocked orientation.
Figure 4:
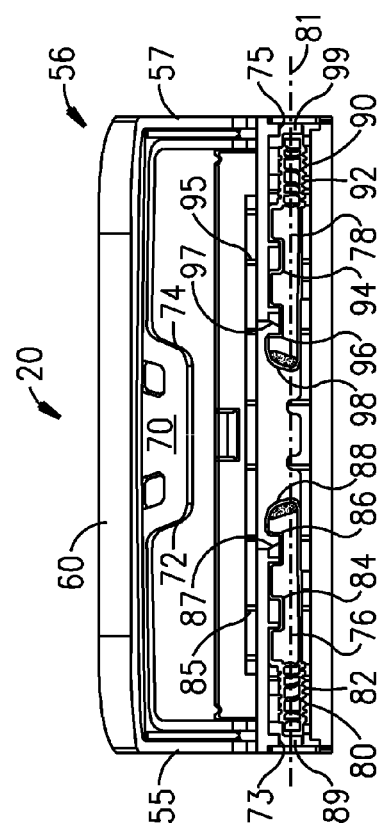
FIG. 4 is a side view of a portion of the component taken along section 4-4 in FIG. 1 including the securing apparatus of the present invention in an unlocked orientation.

FIG. 2 is a front view of a portion of a component including the securing apparatus of the present invention in an unlocked orientation. FIG. 3 is a side view of a portion of the component taken in direction 3-3 in FIG. 1 including the securing apparatus of the present invention in an unlocked orientation. FIG. 4 is a side view of a portion of the component taken along section 4-4 in FIG. 1 including the securing apparatus of the present invention in an unlocked orientation. Referring to FIGS. 2-4, a front piece 20 includes a face member 50 having a ventilating section 52, a display section 54 and a latching member 56. Face member 50 is generally rectangular in shape having opposing sides 51, 53 and opposing sides 55, 57. Latching member 56 includes an actuating member such as a handle 60 pivotally assembled with face member 50 at pivot members 62, 64. As best seen in FIG. 3, pivot member 64 may, by way of example and not by way of limitation, be configured as a pin 66 affixed to or integrally formed with face member 50 inserted within an aperture 68 in handle 60. A camming member 70 is attached with or integrally formed with handle 60 and presents camming surfaces 72, 74.

Latching member 56 also includes latching assemblies 76, 78. Latching assembly 76 includes a latch member 80 and a bias member 82. Latch member 80 is generally oriented about an axis 81. Axis 81 is generally parallel with opposing sides 51, 53. Bias member 82 urges latch member 80 along axis 81 toward latching assembly 78. Bias member 82 may be configured as a helical compression spring in surrounding relation about latch member 80. Latch member 80 may include notches 84, 86 placed in relation to static members 85, 87 to limit travel of latch member along axis 81. Static members 85, 87 may be integrally formed with or attached with face member 50. Latching assembly 78 includes a latch member 90 and a bias member 92. Latch member 90 is generally oriented about axis 81. Bias member 92 urges latch member 90 along axis 81 toward latching assembly 76. Bias member 92 may be configured as a helical compression spring in surrounding relation about latch member 90. Latch member 90 may include notches 94, 96 placed iii relation to static members 95, 97 to limit travel of latch member along axis 81. Static members 95, 97 may be integrally formed with or attached with face member 50.

Latch member 80 also includes a camming surface 88 and an engaging end 89. Latch member 90 also includes a camming surface 98 and an engaging end 99. Latch members 80, 90 are oriented in face member 50 to present camming surfaces 88, 98 to camming surfaces 72, 74 when handle 60 is moved in the direction indicated by an arrow 58 (FIG. 3). Urging handle 60 in the direction of arrow 58 with an appropriate force causes camming surfaces 72, 88 to engage, overcome the bias force of bias member 82 and effect movement of latch member 80 substantially along axis 81 in a direction away from latching assembly 78. Urging handle 60 in the direction of arrow 58 with an appropriate force substantially simultaneously causes camming surfaces 74, 98 to engage, overcome the bias force of bias member 92 and effect movement of latch member 90 substantially along axis 81 in a direction away from latching assembly 76. Latch members 80, 90 are moved outward toward walls 55, 57 as handle 60 is urged in direction 58 to a locked position described hereinafter in connection with FIGS. 5-7.

Face member 50 has an aperture 73 in side 55 substantially centered about axis 81. Face member 50 also has an aperture 75 in side 57 substantially centered about axis 81. Outward movements of latch members 80, 90 toward walls 55, 57 caused by urging handle 60 to a locked position cause engaging ends 89, 99 to pass through apertures 73, 75 and engage a latching structure in an associated receiver structure such as a receiving rack 12 (FIG. 1). By way of example and not by way of limitation, a latching structure for engaging with engaging end 89 may be an aperture through one of tabs 34, 36, 38 in wall $22_3$ (FIG. 1). By way of further example and not by way of limitation, a latching structure for engaging with engaging end 99 may be an aperture through one of tabs 26, 28, 30 in wall 22₂ (FIG. 1).

An alternate embodiment of the present invention may, by way of example and not by way of limitation, provide for rotating face plate 50 substantially ninety degrees with respect to a receiving rack 12 (e.g., see FIG. 1) so that engaging ends 89, 99 pass through apertures 73, 75 to engage apertures 31 in adjacent bottom members of vertically stacked receiving racks 12 (FIG. 1).

Handle 60 may also include a rejection cam structure. Best seen in FIG. 3, a rejection cam structure 67 is attached with or, preferably, integrally formed with handle 60 substantially adjacent to pivot member 64. When handle 60 is moved in a direction opposite to arrow 58 (FIG. 3), rejection cam structure 67 is urged against a structural portion of receiving rack 12 (FIG. 1), such as tab 28 in wall 22₂. Further urging of handle 60 in a direction opposite to arrow 58 will effect pushing face member 50 (and its attached component 10; FIG. 1) outward from engagement with receiving rack 12. Preferably a similar rejection cam structure is provided with handle 60 substantially adjacent to pivot member 62 (not visible in FIGS. 2-4) for interaction with another structural portion of receiving rack 12, such as tab 36 in wall 22₃.

FIG. 5 is a front view of a portion of a component including the securing apparatus of the present invention in a locked orientation. FIG. 6 is a side view of a portion of the component taken in direction 6-6 in FIG. 5 including the securing apparatus of the present invention in a locked orientation. FIG. 7 is a side view of a portion of the component taken along section 7-7 in FIG. 5 including the securing apparatus of the present invention in a locked orientation. Referring to FIGS. 5-7, like elements in FIGS. 5-7 and in FIGS. 2-4 are labeled using like reference numerals to simplify this description. In order to avoid prolixity, a detailed description of the structure of the invention will not be repeated here except as is necessary to describe how the structure is changed in the locked orientation as compared with the unlocked orientation (FIGS. 2-4). As best seen in FIGS. 6 and 7, handle 60 is in a locked orientation having been urged in the direction of arrow 58 (FIG. 3) into substantially abutting relation with face member 50. Camming member 70 is positioned to engage camming surfaces 72, 74 with camming surfaces 88, 98. In the locked orientation illustrated in FIGS. 5-7, camming member 70 has been urged through all travel available to it so that latch members 80, 90 are at their most distal position available with respect to each other substantially along axis 81. Engaging ends 89, 90 are thereby extended their maximum extent available substantially along axis 81 through apertures 73, 75. In this maximally extended locked orientation a latching extension of length "d" is presented by each of latching members 80, 90 beyond face member 50 for engagement with a latching structure in an associated receiver structure such as a receiving rack 12 (FIG. 1). By way of example and not by way of limitation, a latching structure for engaging with engaging end 89 may be an aperture through one of tabs 34, 36, 38 (not visible in FIG. 5-7) in wall 22₃ (FIG. 1). By way of further example and not by way of limitation, a latching structure for engaging with engaging end 99 may be an aperture 33 through one of tabs 26, 28, 30 (shown in phantom in FIG. 6) in wall 22₂ (FIG. 1).

An alternate embodiment of the present invention may, by way of example and not by way of limitation, provide for rotating face plate 50 substantially ninety degrees with respect to a receiving rack 12 (e.g., see FIG. 1) so that engaging ends 89, 99 pass through apertures 73, 75 to engage apertures 31 in a bottom member 14ₙ or in adjacent bottom members 14ₙ of vertically stacked receiving racks 12 (FIG. 1).

Handle 60 may include a detent structure 100 to aid in retaining handle 60 in its locked orientation substantially abutting face member 50. By way of example and not by way of limitation, detent structure 100 may be configured in dimples 102, 104 for establishing an interference fit with face member 50 when handle 60 is in the locked orientation (FIGS. 5-7). Other detent structures may be employed as desired.

Figure 8:
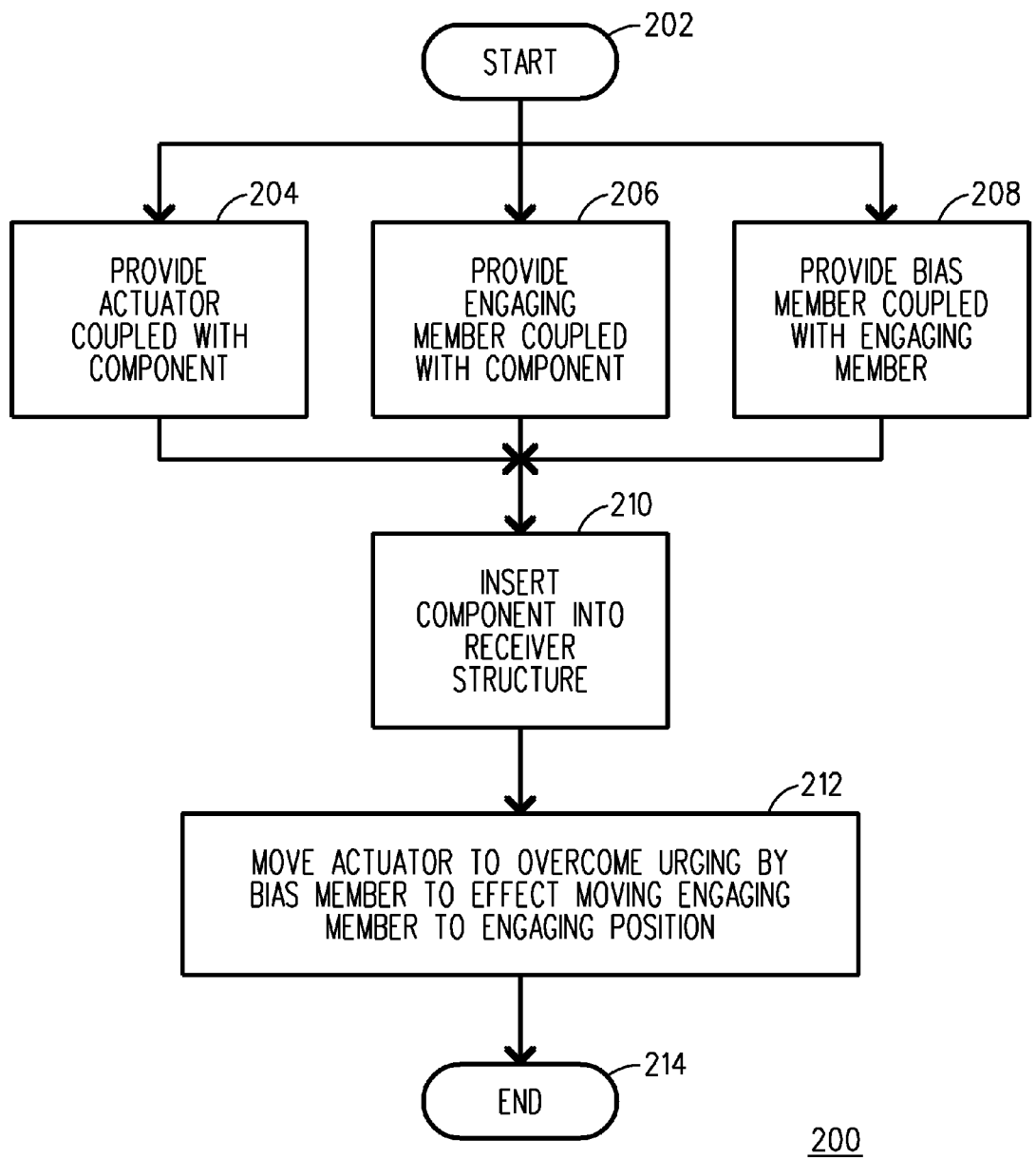
FIG. 8 is a flow chart illustrating the method of the present invention.

FIG. 8 is a flow chart illustrating the method of the present invention. In FIG. 8, a method 200 for securing a component in a receiver structure having an engagement structure begins at a START locus 202. Method 200 continues with the step of, in no particular order: (1) Providing an actuator coupled with the component for swinging movement along a first axis between a first position and a second position, as indicated by a block 204. The actuator is fitted with the component to permit at least partial insertion of the actuator within the receiver structure. (2) Providing at least one engaging member coupled with the component, as indicated by a block 206. The at least one engaging member responds to the actuator moving to one position of the first position and the second position to move in a second axis substantially perpendicular with the first axis into an engaging position with the engagement structure. (3) Providing at least one bias member coupled with the at least one engaging member, as indicated by a block 208. The at least one bias member urges the at least one engaging member from the engaging position.

Method 200 continues, with the actuator in another of the first position and the second position than the one position, by inserting the component into the receiver structure until the component is substantially seated within the receiving structure, as indicated by a block 210. Method 200 continues by moving the actuator from the other position to the one position with sufficient force to overcome the urging by the bias member to effect moving the at least one engaging member to the engaging position, as indicated by a block 212. Method 200 terminates at an END locus 214.

The camming action effected by handle 60 during locking a component within a receiving structure and during removal of a component from a receiving structure provides a controlled action that avoids bending or other trauma to contacts or pins or other contacting structures that are coupled between interface circuitry 16 and component interface circuitry 18. While the invention may effect latching between a component and a receiving structure only on one side, the provision for two-sided locking engagement improves security of the interface established between an inserted component and a receiving structure. Detents provided on handle 60 contribute to prevention of unintended loosening of the interface established between an inserted component and a receiving structure such as may be caused by vibration, temperature changes or other conditions.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

I claim:

1. An apparatus securing a component in a receiver structure; said receiver structure having an engagement structure; the apparatus comprising:

(a) an actuator coupled with said component for swinging movement along a first axis between a first position and a second position;

(b) at least one engaging member coupled with said component; said at least one engaging member responding to said actuator moving to one position of said first position and said second position to move in a second axis substantially perpendicular with said first axis into an engaging position with said engagement structure; and (c) at least one bias member coupled with said at least one engaging member; said at least one bias member urging said at least one engaging member from said engaging position;

said actuator being fitted with said component to permit at least partial insertion of said actuator within said receiver structure; wherein said at least one engaging member responding to said actuator is effected by a camming action between said actuator and said at least one engaging member, urging said at least one engaging member against said at least one bias member towards said engaging position.

2. An apparatus securing a component in a receiver structure as recited in claim 1 wherein said receiver structure further has a static rejection structure and said actuator has a movable rejection structure; said movable rejection structure cooperating with said static rejection structure to urge said component from said receiver structure as said actuator moves from said one position to another of said first position and said second position than said one position.

3. An apparatus securing a component in a receiver structure as recited in claim 2 wherein said cooperating by said movable rejection structure and said static rejection structure is effected by a camming action between said movable rejection structure and said static rejection structure.

4. An apparatus securing a component in a receiver structure as recited in claim 1 wherein said receiver structure further has a static rejection structure and said actuator has a movable rejection structure; said movable rejection structure cooperating with said static rejection structure to urge said component from said receiver structure as said actuator moves from said one position to another of said first position and said second position than said one position.

5. An apparatus securing a component in a receiver structure as recited in claim 4 wherein said cooperating by said movable rejection structure and said static rejection structure is effected by a camming action between said movable rejection structure and said static rejection structure.

6. An apparatus securing a component within a space in a receiver structure; said space having a space width and a space height; said receiver structure having an engagement structure; the apparatus comprising:

(a) an actuating member coupled with said component for movement along a first axis between a first position and a second position; said actuating member having an actuator width less than said space width; said actuating member having an actuator height less than said space height;

(b) an engaging member slidingly coupled with said component; said engaging member responding to movement of said actuating member to one position of said first position and said second position to move in a second axis substantially perpendicular with said first axis to slide toward an engaging position with said engagement structure; said engaging member being in said engaging position with said engagement structure when said actuating member is in said one position; and (c) a bias structure coupled with said engaging member for urging said engaging member from said engaging position wherein said engaging member responding to said actuating member is effected by a camming action between said actuating member and said engaging member, urging said engaging member against said bias structure towards said engaging position.

7. An apparatus securing a component within a space in a receiver structure as recited in claim 6 wherein said receiver structure further has a static rejection structure and said actuating member has a movable rejection structure; said movable rejection structure cooperating with said static rejection structure to urge said component from said space as said actuating member moves from said one position to another of said first position and said second position than said one position.

8. An apparatus securing a component within a space in a receiver structure as recited in claim 7 wherein said cooperating by said movable rejection structure and said static rejection structure is effected by a camming action between said movable rejection structure and said static rejection structure.

9. An apparatus securing a component within a space in a receiver structure as recited in claim 6 wherein said receiver structure further has a static rejection structure and said actuating member has a movable rejection structure; said movable rejection structure cooperating with said static rejection structure to urge said component from said space as said actuating member moves from said one position to another of said first position and said second position than said one position.

10. An apparatus securing a component within a space in a receiver structure as recited in claim 9 wherein said cooperating by said movable rejection structure and said static rejection structure is effected by a camming action between said movable rejection structure and said static rejection structure.

11. A method for securing a component in a receiver structure; said receiver structure having an engagement structure; the method comprising the steps of:

(a) in no particular order:

(1) providing an actuator coupled with said component for swinging movement along a first axis between a first position and a second position; said actuator being fitted with said component to permit at least partial insertion of said actuator within said receiver structure;

(2) providing at least one engaging member coupled with said component; said at least one engaging member responding to said actuator moving to one position of said first position and said second position to move in a second axis substantially perpendicular with said first axis into an engaging position with said engagement structure; and (3) providing at least one bias member coupled with said at least one engaging member; said at least one bias member urging said at least one engaging member from said engaging position;

(b) with said actuator in another of said first position and said second position than said one position, inserting said component into said receiver structure until said component is substantially seated within said receiving structure; and (c) moving said actuator from said other position to said one position with sufficient force to overcome said urging by said at least one bias member to effect moving said at least one engaging member to said engaging position wherein said engaging member responding to said actuating member is effected by a camming action between said actuating member and said engaging member, urging said at least one engaging member against said at least one bias member towards said engaging position.

12. A method for securing a component in a receiver structure as recited in claim 11 wherein said receiver structure further has a static rejection structure and said actuating member has a movable rejection structure; said movable rejection structure cooperating with said static rejection structure to urge said component from said space as said actuating member moves from said one position to another of said first position and said second position than said one position.

13. A method for securing a component in a receiver structure as recited in claim 12 wherein said cooperating by said movable rejection structure and said static rejection structure is effected by a camming action between said movable rejection structure and said static rejection structure.

14. A method for securing a component in a receiver structure as recited in claim 12 wherein said receiver structure further has a static rejection structure and said actuating member has a movable rejection structure; said movable rejection structure cooperating with said static rejection structure to urge said component from said space as said actuating member moves from said one position to another of said first position and said second position than said one position.

15. A method for securing a component in a receiver structure as recited in claim 14 wherein said cooperating by said movable rejection structure and said static rejection structure is effected by a camming action between said movable rejection structure and said static rejection structure.

* * * * *